(12) United States Patent
Okazaki

(10) Patent No.: US 8,581,367 B2
(45) Date of Patent: Nov. 12, 2013

(54) SEMICONDUCTOR DEVICE HAVING ELECTRODE FILM IN WHICH FILM THICKNESS OF PERIPHERY IS THINNER THAN FILM THICKNESS OF CENTER

(75) Inventor: Tadahiro Okazaki, Kyoto (JP)

(73) Assignee: Rohm Co., Ltd., Kyoto-Fu (JP)

( * ) Notice: Subject to any disclaimer, the term of this patent is extended or adjusted under 35 U.S.C. 154(b) by 355 days.

(21) Appl. No.: 12/230,577

(22) Filed: Sep. 2, 2008

(65) Prior Publication Data

US 2009/0057836 A1 Mar. 5, 2009

(30) Foreign Application Priority Data

Sep. 3, 2007 (JP) ................................. 2007-227515

(51) Int. Cl.
*H01L 29/861* (2006.01)
(52) U.S. Cl.
USPC .............. 257/615; 257/44; 257/45; 257/46; 257/76; 257/77; 257/E29.255; 257/E29.246; 257/E29.327; 257/E21.09

(58) Field of Classification Search
USPC .......... 257/44–46, 104, 76–77, 615, E29.255, 257/E21.09, E29.246; 438/478
See application file for complete search history.

(56) References Cited

U.S. PATENT DOCUMENTS

| 4,965,643 A * | 10/1990 | Freeman ........................ 257/73 |
| 6,031,254 A * | 2/2000 | Quoirin ........................ 257/155 |
| 6,404,033 B1 * | 6/2002 | Chang et al. .................. 257/484 |
| 6,426,542 B1 * | 7/2002 | Tan ............................ 257/483 |
| 2002/0070380 A1 * | 6/2002 | Andoh ........................... 257/46 |

FOREIGN PATENT DOCUMENTS

JP 5-326697 12/1993

* cited by examiner

*Primary Examiner* — Ermias Woldegeorgis
(74) *Attorney, Agent, or Firm* — Rabin & Berdo, P.C.

(57) ABSTRACT

A semiconductor device includes a substrate having first main face having rectangular shape, a first electrode provided at the center on first main face of substrate, first electrode is made of conducting material harder than substrate, and a second electrode provided along at least a part of the periphery on first main face so as to surround first electrode, second electrode is integrated with first electrode by the same conducting material as that of the first electrode, and second electrode has a thinner film thickness than that of the first electrode.

21 Claims, 4 Drawing Sheets

SEMICONDUCTOR DEVICE HAVING ELECTRODE FILM IN WHICH FILM THICKNESS OF PERIPHERY IS THINNER THAN FILM THICKNESS OF CENTER

CROSS REFERENCE TO RELATED APPLICATIONS AND INCORPORATION BY REFERENCE

This application is based upon and claims the benefit of priority from prior Japanese Patent Application P2007-227515 filed on Sep. 3, 2007; the entire contents of which are incorporated by reference herein.

BACKGROUND OF THE INVENTION

Field of the Invention

The present invention relates to a semiconductor device. In particular, the present invention relates to a semiconductor device including a semiconductor element in which principal current flows in the thickness direction of a substrate.

As a semiconductor device on which a diode is provided, a semiconductor device has been used that has a configuration in which a substrate is used as a cathode region and an anode region adjacent to the cathode region is provided on a surface of the substrate. The anode region has thereon a protection film. This protection film includes a connection hole through which the anode region is electrically connected to an anode electrode (surface electrode). At a back face of the substrate, a cathode electrode directly electrically connected to the cathode region (back face electrode) is provided.

This type of semiconductor device is manufactured in the manner as described below. A plurality of the semiconductor devices are simultaneously manufactured in a wafer (substrate). Then, the wafer is subjected to a dicing step to divide the wafer to individual semiconductor devices (chipping). The anode electrode and the cathode electrode are already formed prior to the dicing step. The dicing step uses a dicing blade to cut the wafer in a dicing area (scribe area) of the wafer. Generally, the dicing step places the dicing blade to the surface of the wafer to cut the wafer.

The above-described semiconductor device including a diode has not considered the following point. Specifically, when wafer is a gallium nitride (GaN) wafer for example, a cathode electrode (back face electrode) used for the back face of the wafer is a silver-nickel (AgNi) alloy film for example. The AgNi alloy is conducting material harder than a GaN wafer. Due to the hard cathode electrode, the stress caused by the dicing operation by the dicing blade in the dicing step is concentrated at an interface between the wafer and the cathode electrode. This concentrated stress causes many cracks in a dicing face of the wafer (i.e., a side face of the substrate) in the vicinity of the back face of the wafer having a fixed distance from the interface between the wafer and the cathode electrode. The side face of the substrate is exposed and is not subjected to any particular post-processing. Due to this reason, the electrical characteristic of the diode provided in the semiconductor device (i.e., a forward bias characteristic and a reverse bias characteristic) is deteriorated due to the cracks generated in the side face of the substrate.

Furthermore, when the cracks caused in the side face of the substrate is subjected to an environment where the operation of the diode is repeated to cause a heat cycle, the cracks turn into weld flash-like crack (burr-like crack) as time passes. This causes, when a plurality of semiconductor devices are mounted to be adjacent to one another on a common substrate to provide a multi-chip configuration, the neighboring semiconductor devices to have there among electric short, thereby deteriorating the electrical reliability.

The semiconductor device having the deteriorated electrical characteristic and the semiconductor device inducing a short circuit must be excluded as a defective product in an examination step after the manufacture. This causes a decline in the manufacture yield of the semiconductor device.

SUMMARY OF THE INVENTION

The present invention provides a semiconductor device that can improve the electrical characteristic of the semiconductor element and that can improve the fabrication yield.

An aspect of the present invention is a semiconductor device comprises a substrate having a first main face having a rectangular shape; a first electrode provided at the center on the first main face of the substrate, the first electrode is made of conducting material harder than the substrate; and a second electrode provided along at least a part of the periphery on the first main face so as to surround the first electrode, the second electrode is integrated with the first electrode by the same conducting material as a conducting material of the first electrode, and the second electrode has a thinner film thickness than a film thickness of the first electrode.

DETAILED DESCRIPTION OF THE INVENTION

Figure 1:
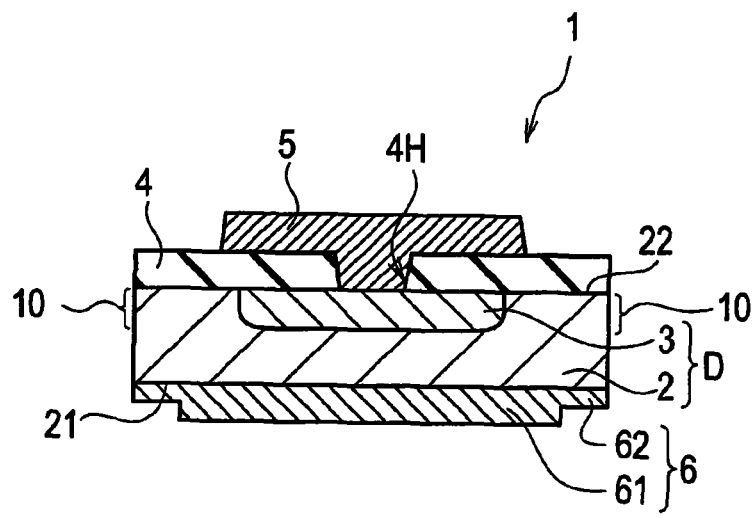
FIG. 1 is a cross-sectional view illustrating a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

An embodiment of the present invention will describe an example in which the present invention is applied to a semiconductor device including a diode.

[Configuration of Semiconductor Device]

Figure 2:
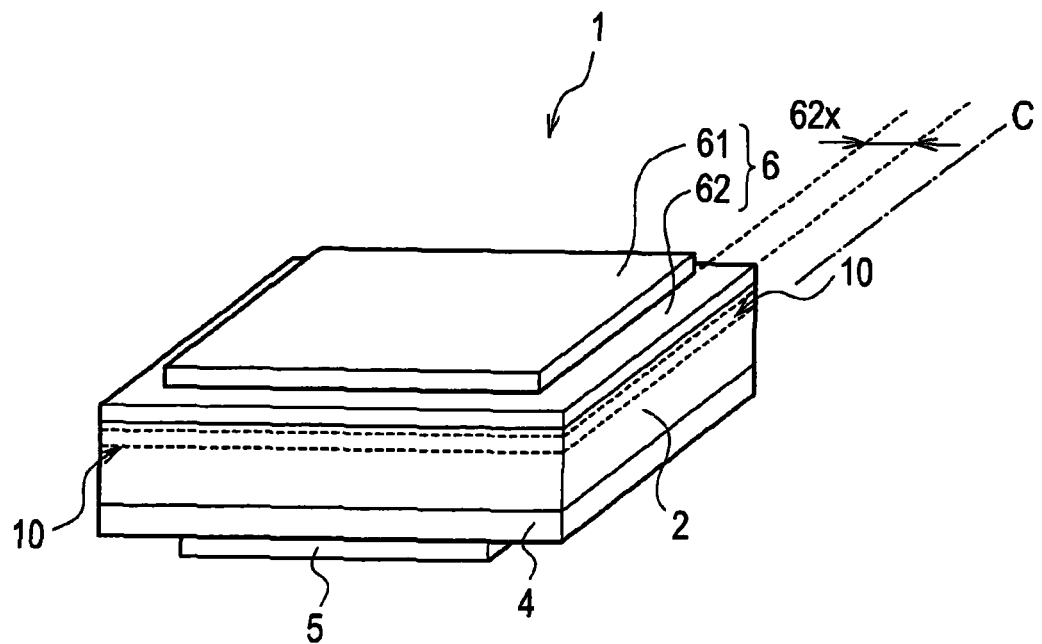
FIG. 2 is a perspective view illustrating the semiconductor device shown in FIG. 1.

As shown in FIG. 1, a semiconductor device 1 according to the embodiment includes: a substrate 2 having the first main face 21 having a rectangular shape; the first electrode 61 that is provided at the center of the first main face 21 of the substrate 2 and that is made of conducting material harder than the substrate 2; and the second electrode 62 that is provided along at least a part of the periphery of the first main face 21 so as to surround the first electrode 61, that is integrated with the first electrode 61 by the same conducting material as that of the first electrode 61, and that has a thinner film thickness than that of the first electrode 61. In FIG. 1, the first main face 21 is a back face of the substrate 2 facing the lower side. In FIG. 2, the first main face 21 is the back face of the substrate 2 facing the upper side. In this embodiment, the second electrode 62 is provided along the entire area of the periphery of the first main face 21 of the substrate 2. Specifically, on the entire face on the first main face 21 (back face) of the substrate 2, an electrode layer having the second electrode 62 is formed that is continuous from the first electrode 61 at the first electrode 61 and the periphery of the first electrode 61 and that has a thinner film thickness than that of the first electrode 61. The first electrode 61 and the second electrode 62 constitute a part of electrode layers continuously formed on the first main face 21, respectively. Specifically, the semiconductor device 1 includes electrode layers that are continuously provided on the first main face 21 and that have a plurality of regions having different thicknesses. The semiconductor device 1 includes a diode D.

In this embodiment, the substrate 2 is an n-type GaN substrate. The substrate 2 shown in FIG. 1 and FIG. 2 is already divided (or chipped) by the dicing step of the method for manufacturing the semiconductor device 1. A plurality of semiconductor device formation regions are formed in a matrix-like manner in the wafer (the substrate 2). The dicing step dices the wafer along the dicing areas arranged among the semiconductor device formation regions in a row direction and in a column direction. Thus, the substrate 2 has a rectangular main face. The substrate 2 is used as a cathode region of the diode D. The substrate 2 also may be a silicon nitride (SiC) substrate or a silicon (Si) substrate for example in the practical use.

A p-type semiconductor region 3 is provided so as to be contacted to the second main face 22 of the substrate 2 opposed to the first main face 21 (i.e., the surface part of the cathode region (2)). Specifically, in the substrate 2 including at least a part of the second main face 22, the p-type semiconductor region 3 of a different conductivity type from that of the substrate 2 is formed. The p-type semiconductor region 3 is used as an anode region of the diode D. In FIG. 1, the second main face 22 is the surface of the second main face 22 facing the upper side. In FIG. 2, the second main face 22 is the surface of the second main face 22 facing the lower side. The diode D is formed at a pn junction part of the cathode region (2) and the anode region (3). Along the thickness direction of the substrate 2, principal current of the diode D flows in the longitudinal direction.

A passivation film 4 is provided over the entire area of the second main face 22 (surface) of the substrate 2. The passivation film 4 is, for example, a silicon dioxide ($SiO_2$) film for practical use. The passivation film 4 has thereon the third electrode 5. The third electrode 5 is electrically connected to the p-type semiconductor region (anode region) 3 via a connection hole 4H provided in the passivation film 4. The third electrode 5 is used as an anode electrode. The third electrode 5 is made of conducting material such as aluminum (Al) or silver (Ag) for practical use. The third electrode 5 has a film thickness set to 1 μm to 2 μm for example.

The first electrode 61 and the second electrode 62 provided on the first main face 21 (back face) of the substrate 2 are used as a cathode electrode 6. The first electrode 61 and the second electrode 62 are directly electrically connected to the first main face 21 of the substrate 2 (cathode region 2) without providing insulating material therebetween. The first electrode 61 and the second electrode 62 can be an AgNi alloy film for example for practical use. The first electrode 61 and the second electrode 62 also may be a tungsten (W) film. The first electrode 61 has a film thickness set to 1.0 μm for example. The second electrode 62 has a film thickness set to 0.1 μm to 0.5 μm that is about 10% to 50% of the film thickness of the first electrode 61. The second electrode 62 is provided along the entire periphery of the first main face 21 of the substrate 2 (i.e., dicing area). Since the second electrode 62 has a thinner film thickness than a film thickness of the first electrode 61, the stress transmitted from the dicing blade to the substrate 2 during the dicing step is reduced.

The second electrode 62 has a width size (i.e., a size extending from an end face of the substrate 2 to the center of the substrate 2). This width size is set in consideration of the blade width of the dicing blade (thickness) and a wobbling width of the dicing blade during a dicing operation. For example, when the dicing blade has a blade width of 20 μm and a wobbling width of 10 μm (±5 μm), the sum of 5 μm that is a half of the wobbling width and a buffer region is taken into consideration and a distance from a blade center (center of the dicing area) C shown in FIG. 2 to the end face of the second electrode 62 is set in a range from 30 μm to 40 μm. After the dicing step, a width size 62x (the width size 62x is a size from the end face of the substrate 2 to an end of the first electrode 61) is actually left as the second electrode 62 of the semiconductor device 1 to have a length of 15 μm to 20 μm.

In the semiconductor device 1 according to this embodiment, the second electrode 62 also may be provided with a fixed interval along the periphery of the substrate 2. For example, the second electrode 62 may be provided at a corner part of the substrate 2 to which the stress is easily concentrated in the dicing step and the first electrode 61 may be provided along the periphery of the substrate 2 (the respective sides of the substrate 2). Specifically, only the corner part of the substrate 2 may have a reduced film thickness among the film thickness of the electrode provided on the first main face 21.

[First Manufacture Method of Semiconductor Device]

Figure 3:
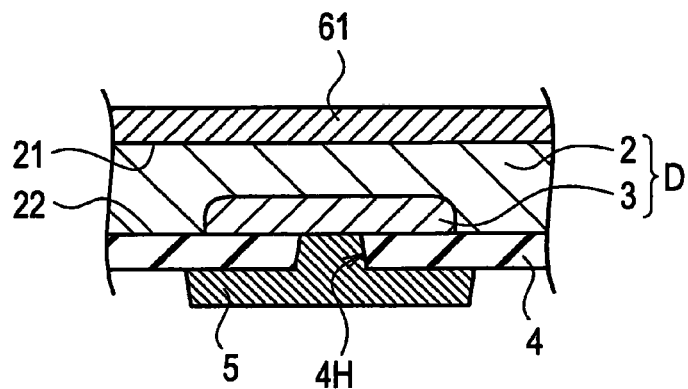
FIG. 3 is a cross-sectional view for explaining the first manufacture method for manufacturing the semiconductor device shown in FIG. 1.
Figure 4:
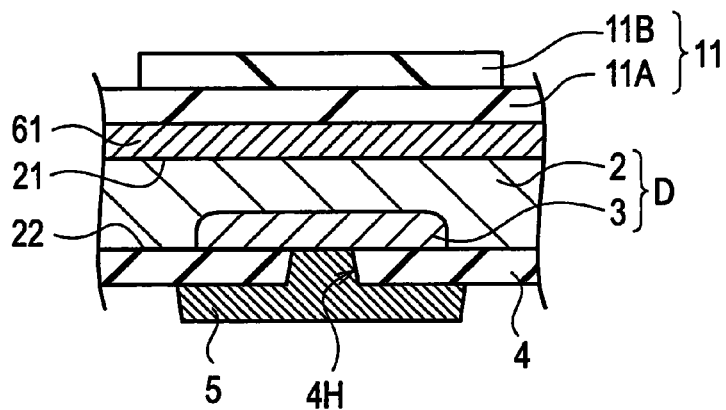
FIG. 4 is a cross-sectional view for explaining the first manufacture method.
Figure 5:
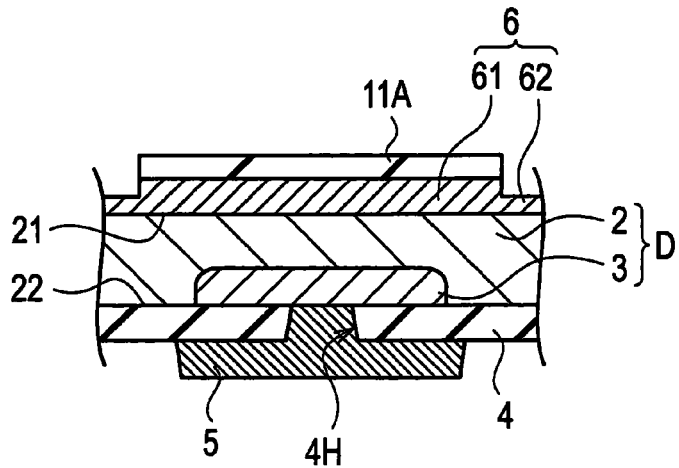
FIG. 5 is a cross-sectional view for explaining the first manufacture method.

The following section will describe the first manufacture method of the semiconductor device 1 according to the embodiment with reference to FIG. 3 to FIG. 5. The first manufacture method is a manufacture method using a mask having a two-layered structure.

First, the diode D is formed on the surface of the substrate 2. On the second main face 22 of the substrate 2, the passivation film 4, the connection hole 4H, and the third electrode (anode electrode) 5 are sequentially formed (see FIG. 3). The substrate 2 is a GaN wafer. The substrate 2 shown in FIG. 3 is a wafer before the dicing step.

As shown in FIG. 3, the first electrode 61 is formed on the entire area on the first main face 21 of the substrate 2. The first electrode 61 is an AgNi alloy film that is formed by sputtering for example.

As shown in FIG. 4, a mask 11 is formed on the first electrode 61. The mask 11 has a two-layered structure. Specifically, the mask 11 has the first mask 11A (lower layer mask) formed on the entire area on the back face of the substrate 2 and the second mask 11B (upper layer mask) formed at the center except for the periphery on the first mask 11A. The term "center" means the center of the first main face 21 of the substrate 2 and is a region on which the first electrode 61 is formed. The term "periphery" means the periphery of the first main face 21 of the substrate 2 and is a region on which the second electrode 62 is formed. The first mask 11A and the second mask 11B are a photoresist film formed by the photolithography technique for example.

As shown in FIG. 5, the mask 11 is used to etch the first electrode 61. In the two-layered structure part in which the first mask 11A and the second mask 11B are formed, the first electrode 61 is not etched. At the periphery of the first main face 21 of the substrate 2 in which only the first mask 11A of the mask 11 is formed on the other hand, the first the mask 11A is completely removed by the etching and a part of the upper part of the first electrode 61 is etched. This results in the second electrode 62 having a thinner film thickness than a film thickness at of the first electrode 61 provided at the periphery of the first main face 21. This etching is carried out by anisotropic etching such as the reactive ion etching (RIE) for practical use for example. After the etching, the mask 11 (particularly the first mask 11A remaining on the first electrode 61) is removed.

Thereafter, the dicing step divides the substrate 2, thereby completing the semiconductor device (chip) 1. The dicing is started from the surface of the substrate 2 (the second main face 22).

[Second Manufacture Method of Semiconductor Device]

Figure 6:
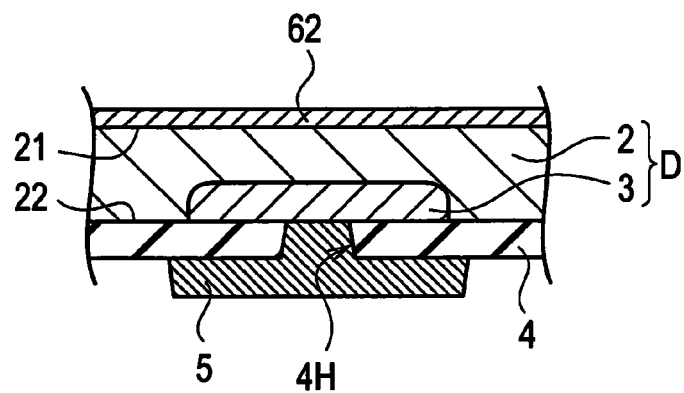
FIG. 6 is a cross-sectional view for explaining the second manufacture method.
Figure 7:
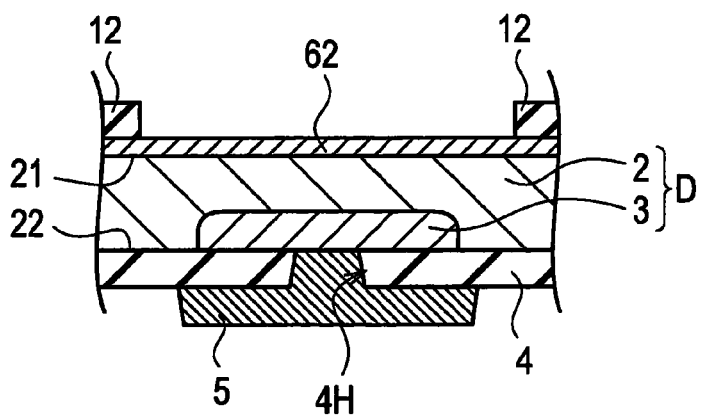
FIG. 7 is a cross-sectional view for explaining the second manufacture method.
Figure 8:
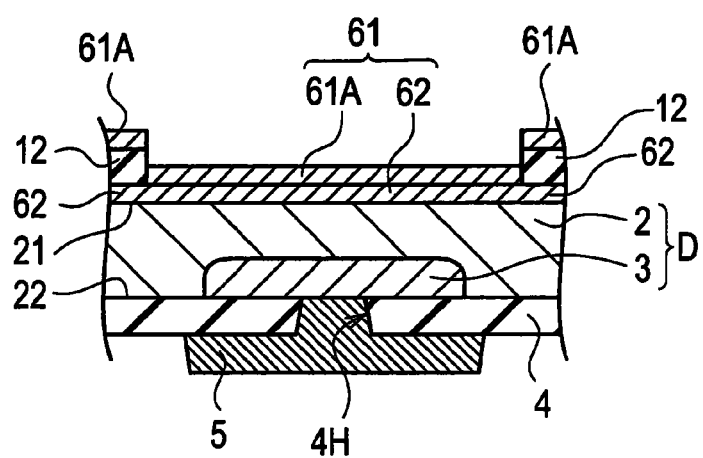
FIG. 8 is a cross-sectional view for explaining the second manufacture method.

The following section will describe the second manufacture method of the semiconductor device 1 according to the embodiment with reference to FIG. 6 to FIG. 8. This second manufacture method is a manufacture method using the liftoff technique.

First, the diode D is formed on the surface of the substrate 2. The passivation film 4, the connection hole 4H, and the third electrode (anode electrode) 5 are sequentially formed on the second main face 22 of the substrate 2 (see FIG. 6). The substrate 2 is a GaN wafer. The substrate 2 shown in FIG. 6 is a wafer prior to the dicing step.

As shown in FIG. 6, the second electrode 62 is formed on the entire area on the first main face 21 of the substrate 2. The second electrode 61 is an AgNi alloy film that is formed by sputtering for example.

As shown in FIG. 7, a mask 12 is placed on the periphery except for the center of the second electrode 61. The mask 12 is a photoresist film formed by the photolithography technique for example.

As shown in FIG. 8, the first electrode formation film 61A is formed on the mask 12 formed on the center and periphery of the second electrode 62. The first electrode formation film 61A is an AgNi alloy film that is formed by sputtering for example. At the center of the first main face 21 of the substrate 2, the second electrode 62 and the first electrode formation film 61A formed on the second electrode 62 constitute the first electrode 61 having a thicker film thickness than a film thickness of the second electrode 62. Thereafter, the mask 12 is removed so that the unnecessary first electrode formation film 61A on the mask 12 is removed. At the region from which the mask 12 is removed (periphery), the previously-formed second electrode 62 is exposed.

Thereafter, the dicing step divides the substrate 2, thereby completing the semiconductor device (chip) 1. The dicing step is started from the surface of the substrate 2 (the second main face 22).

[Third Manufacture Method of Semiconductor Device]

Figure 9:
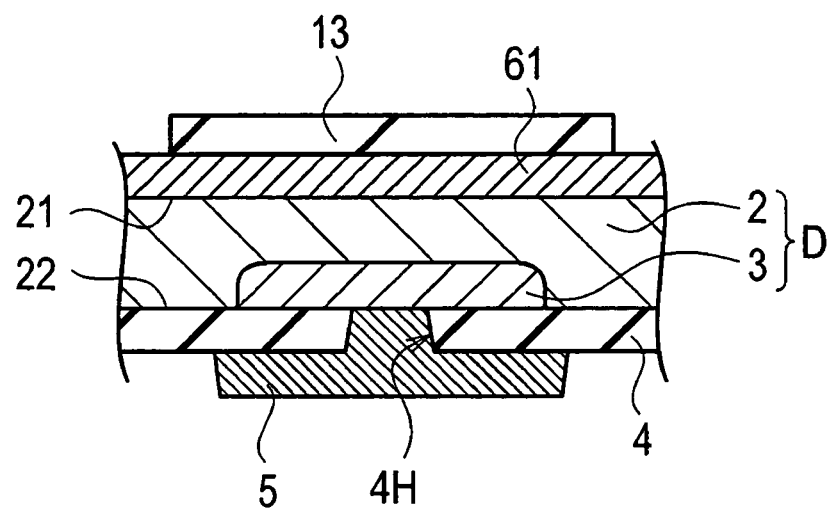
FIG. 9 is a cross-sectional view for explaining the third manufacture method of the semiconductor device shown in FIG. 1.
Figure 10:
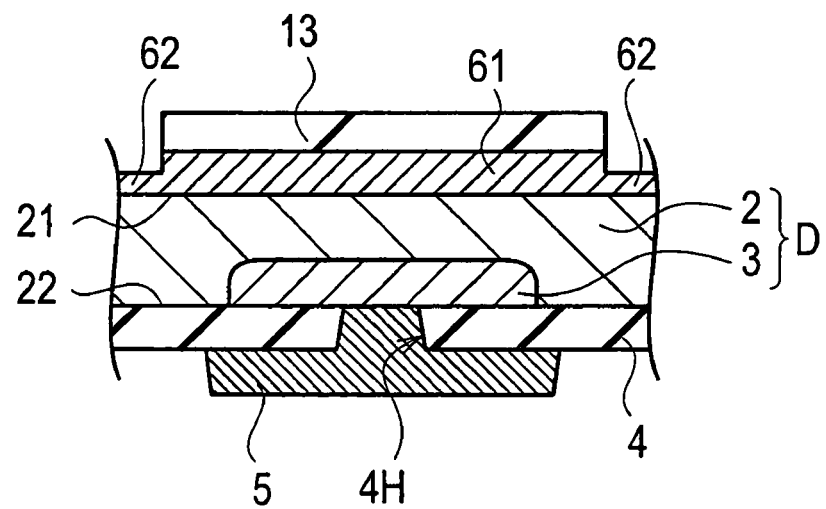
FIG. 10 is a cross-sectional view for explaining the third manufacture method.

The following section will describe the third manufacture method of the semiconductor device 1 according to the embodiment with reference to FIG. 9 and FIG. 10. The third manufacture method is the simplest manufacture method.

First, as shown in FIG. 3 referred to for the above-described first manufacture method, the first electrode 61 is formed on the entire area on the first main face 21 of the substrate 2.

As shown in FIG. 9, a mask 13 is formed on the center of the first electrode 61 except for the periphery. The mask 13 is a photoresist film formed by the photolithography technique for example.

As shown in FIG. 10, the mask 13 is used to remove the periphery of the first electrode 61 by the etching. The first electrode 61 under the mask 13 is not etched and remains. At the periphery of the first main face 21 of the substrate 2 in which the mask 13 does not exist on the other hand, a part of the upper part of the first electrode 61 is etched, thereby forming the second electrode 62 having a thinner film thickness than a film thickness of the first electrode 61. The etching is performed by the anisotropic etching such as RIE for practical use. After the etching, the mask 13 is removed.

Thereafter, the dicing step divides the substrate 2, thereby completing the semiconductor device (chip) 1. The dicing is started from the surface of the substrate 2 (the second main face 22).

As described above, the semiconductor device 1 according to the embodiment of the present invention includes the first electrode 61 provided at the center of the first main face 21 of the substrate 2 and the second electrode 62 that is provided at the periphery of the first main face 21 and the second electrode 62 has a thinner film thickness than a film thickness of the first electrode 61. Since the second electrode 62 has a reduced hardness enabled by the reduced film thickness thereof, the stress caused by the dicing blade during the dicing step is suppressed from being concentrated at the interface between the substrate 2 and the second electrode 62. This can prevent cracks in the dicing face of the substrate 2 (i.e., the side face of the substrate 2) in the vicinity of the back face of the substrate 2 having a fixed distance from the interface (which is shown by the reference numeral 10 in FIG. 1 and FIG. 2). As a result, the diode D is prevented from having deteriorated forward bias characteristic and reverse bias characteristic, thus providing the semiconductor device 1 with an improved electrical characteristic. The improved electrical characteristic achieves the reduction of defective products in the examination step after the manufacture. In other words, the fabrication yield of the semiconductor device 1 improves.

Since the semiconductor device 1 prevents cracks in the side face of substrate 2, no crack exists that turn into weld flash-like (burr-like) cracks in an environment where the operation of the diode D is repeated to cause a heat cycle. Thus, no short circuit is caused among a plurality of the semiconductor devices 1 in a multi-chip configuration in which the semiconductor devices 1 are mounted on a common substrate to be adjacent to one another, thus providing an improved electrical reliability.

OTHER EMBODIMENTS

Although the present invention has been described based on the above-described embodiment as described above, the description and drawings constituting a part of this disclosure does not limit this invention. For example, the present invention is not limited to the semiconductor device 1 including the diode D. The present invention is also applied to a semiconductor device including a power transistor, laser, or light-emitting diode (LED) for example.

Various modifications will become possible for those skilled in the art after receiving the teachings of the present disclosure without departing from the scope thereof.

What is claimed is:

1. A semiconductor device comprising:
    a substrate made of a conducting material and having a first main face having a rectangular shape with a center;
    a first electrode provided at the center on the first main face of the substrate, the first electrode is made of conducting material harder than the substrate; and
    a second electrode provided along at least a part of the periphery on the first main face so as to surround the first electrode, wherein the second electrode has a thinner film thickness than a film thickness of the first electrode and directly contacts the first main face of the substrate, and the second electrode is formed to be indented in a direction which faces to the substrate relative to the first electrode, and the second electrode is flush with the substrate in a lengthwise direction of the substrate; and
    a third electrode in contact with a second main face of the substrate opposed to the first main face, wherein a semiconductor element for flowing principal current between the first electrode and the third electrode is provided on the substrate,
    wherein a combination of the first electrode and the second electrode is in contact over an entire area on the first main face of the substrate, the first electrode and the second electrode are cathode electrodes,
    wherein the first electrode and the second electrode are ohmic-contacted with the substrate, and the third electrode is Schottky-contacted with the substrate, and
    wherein material of each of the first electrode and the second electrode is harder than that of third electrode.

2. The semiconductor device according to claim 1, wherein the second electrode is integrated with the first electrode by the same conducting material as a conducting material of the first electrode.

3. The semiconductor device according to claim 1, wherein the second electrode is provided along the entire area of the periphery on the first main face.

4. The semiconductor device according to claim 1, wherein the thinner film thickness of the second electrode is 10% to 50% of the film thickness of the first electrode.

5. The semiconductor device according to claim 1, further comprising a passivation film provided between the second main face and the third electrode,
    wherein the third electrode is in contact with the second main face via a connection hole provided in the passivation film.

6. The semiconductor device according to claim 1, further comprising a semiconductor region formed in the substrate to include at least a part of a region of the second main face in contact with the third electrode, wherein the semiconductor region is of a different conductivity type from a conductivity type of the substrate.

7. The semiconductor device according to claim 1, wherein the third electrode is one of an aluminum film or a silver film.

8. The semiconductor device according to claim 1, wherein the substrate is a GaN substrate.

9. The semiconductor device according to claim 8, wherein each of the first electrode and the second electrode is a silver-nickel alloy film.

10. The semiconductor device according to claim 1, wherein a plurality of the semiconductor devices in a multi-chip configuration in which the semiconductor devices are mounted on a common substrate to be adjacent to one another.

11. The semiconductor device according to claim 1, wherein all over the first main face is flattened.

12. A semiconductor device comprising:
    a substrate made of a conducting material and having a first main face having a rectangular shape with a center;
    a first electrode provided at the center on the first main face of the substrate, the first electrode made of conducting material harder than the substrate; and
    a second electrode provided with a fixed interval along a periphery of the substrate to be provided at a corner part of the substrate from a planar point of view, wherein the second electrode has a thinner film thickness than a film thickness of the first electrode and directly contacts the first main face of the substrate, and the second electrode is formed to be indented in a direction which faces to the substrate relative to the first electrode, and the second electrode is flush with the substrate in a lengthwise direction of the substrate;
    a third electrode in contact with a second main face of the substrate opposed to the first main face, wherein a semiconductor element for flowing principal current between the first electrode and the third electrode is provided on the substrate,
    wherein the first electrode and the second electrode are cathode electrodes,
    wherein the first electrode and the second electrode are ohmic-contacted with the substrate, and the third electrode is Schottky-contacted with the substrate, and
    wherein material of each of the first electrode and the second electrode is harder than that of third electrode.

13. The semiconductor device according to claim 12, wherein the second electrode is integrated with the first electrode by a same conducting material as a conducting material of the first electrode.

14. The semiconductor device according to claim 12, wherein the second electrode is provided along the entire area of the periphery on the first main face.

15. The semiconductor device according to claim 12, wherein the thinner film thickness of the second electrode is 10% to 50% of the film thickness of the first electrode.

16. The semiconductor device according to claim 12, further comprising a passivation film provided between the second main face and the third electrode,
    wherein the third electrode is contacted to the second main face via a connection hole provided in the passivation film.

17. The semiconductor device according to claim 12, further comprising a semiconductor region formed in the substrate to include at least a part of a region of the second main face contacted to the third electrode, wherein the semiconductor region is of a different conductivity type from a conductivity type of the substrate.

18. The semiconductor device according to claim 12, wherein the third electrode is one of an aluminum film or a silver film.

19. The semiconductor device according to claim 12, wherein the substrate is a GaN substrate.

20. The semiconductor device according to claim 19, wherein each of the first electrode and the second electrode is a silver-nickel alloy film.

21. The semiconductor device according to claim 12, wherein all over the first main face is flattened.

\* \* \* \* \*